(12) United States Patent
Cargill et al.

(10) Patent No.: US 6,707,344 B2
(45) Date of Patent: Mar. 16, 2004

(54) HIGH EFFICIENCY, LOW NOISE FREQUENCY TRIPLER AND METHOD

(75) Inventors: Robert S. Cargill, Portland, OR (US); Gary E. Mueller, Hillsboro, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 58 days.

(21) Appl. No.: 10/042,655

(22) Filed: Jan. 8, 2002

(65) Prior Publication Data

US 2003/0128773 A1 Jul. 10, 2003

(51) Int. Cl.[7] .................................................. H03B 1/00
(52) U.S. Cl. ...................................... 331/74; 331/117 R
(58) Field of Search ............................. 331/60, 74, 75, 331/76, 117 R, 117 D, 117 FE

(56) References Cited

U.S. PATENT DOCUMENTS

| | | | | |
|---|---|---|---|---|
| 3,614,760 A | * | 10/1971 | Zimmet | ...................... 340/224 |
| 5,680,077 A | * | 10/1997 | Jonely et al. | ........... 331/107 A |
| 5,959,504 A | * | 9/1999 | Wang | ................... 331/117 FE |

* cited by examiner

Primary Examiner—Henry Choe
(74) Attorney, Agent, or Firm—Blakely, Sokoloff, Taylor & Zafman LLP

(57) ABSTRACT

High efficiency, low noise frequency tripler and method that generates an enhanced third harmonic of a frequency and suppresses the fundamental frequency component in the tripler output. The method comprises multiplying a constant plus a twice frequency component by a square wave at the fundamental frequency, such as by a modulator. The amplitude of the twice frequency component relative to the constant and the phase of the twice frequency component relative to the phase of the square wave are chosen to reduce the fundamental frequency component and enhance the third harmonic in the tripler output. An implementation using a differential Colpitts oscillator is disclosed.

7 Claims, 1 Drawing Sheet

HIGH EFFICIENCY, LOW NOISE FREQUENCY TRIPLER AND METHOD

BACKGROUND OF THE INVENTION

1. Field of the Invention

The present invention relates to the field of frequency multipliers.

2. Prior Art

Existing frequency triplers are square wave generators that have filtered outputs to select the third harmonic in the square wave output. The circuit consists of an oscillator generating a frequency f and a modulator which, switched at f, produces a train of odd order harmonics in decreasing amplitude:

$$Z = K \times \text{SIGN}(\sin\omega t)$$
$$= K \times \frac{4}{\pi}\left(\sin\omega t + \frac{1}{3}\sin 3\omega t + \frac{1}{5}\sin 5\omega t + \cdots\right)$$

where: $\omega = 2\pi f$

This technique has the disadvantage that the desired harmonic is nearly 10 dB below the fundamental signal, increasing the complexity of filtering required to select the third harmonic. Also, this approach results in extremely poor conversion efficiency, since over 90% of the signal power is wasted in undesired terms.

BRIEF SUMMARY OF THE INVENTION

High efficiency, low noise frequency tripler and method that generates an enhanced third harmonic of a frequency and suppresses the fundamental frequency component in the tripler output. The method comprises multiplying a constant plus a twice frequency component by a square wave at the fundamental frequency, such as by a modulator. The amplitude of the twice frequency component relative to the constant and the phase of the twice frequency component relative to the phase of the square wave are chosen to reduce the fundamental frequency component and enhance the third harmonic in the tripler output. An implementation using a differential Colpitts oscillator is disclosed.

DETAILED DESCRIPTION OF THE PREFERRED EMBODIMENT

The present invention provides a way to suppress the fundamental frequency component in a non-linear process used to generate the third and other odd harmonics of the fundamental frequency, improving conversion efficiency and reducing filtering requirements. Reduced broadband noise is another result of the improved conversion efficiency.

Figure 1:
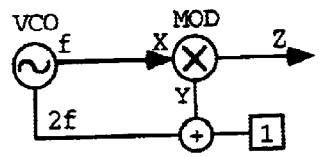
FIG. 1 is a block diagram of a VCO architecture that may be used to practice the present invention.

A preferred embodiment of the invention takes advantage of a VCO architecture that produces the fundamental frequency f as well as the second harmonic 2f, depending upon where the output is taken. This is illustrated schematically in FIG. 1, where the VCO generates the frequency components f and 2f. The second harmonic, with an equal fixed component added (1 in the Figure), is applied to the analog port of a one-quadrant modulator MOD, with the fundamental frequency component providing the modulating signal. Thus:

$$Z = \text{SIGN}(\sin\omega t) \times \left(1 + \sin\left[2\omega t + \frac{\pi}{2}\right]\right)$$

As shown in the above equation, the phasing is chosen such that a modulator transition occurs at every peak in the second harmonic signal. One effect is a slight increase in the RMS current in the 2f multiplicand Y from the constant bias case. It also has the effect of raising the third harmonic amplitude relative to the fundamental and broadband noise.

The effect can be seen by multiplying the analog multiplicand by the Fourier decomposition for the square wave $$Z = (1 + \sin(2\omega t + \phi)) \times \frac{4}{\pi}\left(\sin\omega t + \frac{1}{3}\sin 3\omega t + \frac{1}{5}\sin 5\omega t + \cdots\right)$$

Here, the only frequency components of substantial interest are the fundamental and the third harmonic. The resulting relationship, ignoring higher order products, is:

$$Z = \frac{4}{\pi}\left[\left(\sin\omega t + \frac{1}{3}\sin 3\omega t\right) + \frac{1}{2}\left(\cos(\omega t + \phi) + \frac{1}{3}\cos(\omega t - \phi) - \cos(3\omega t + \phi) + \frac{1}{5}\cos(3\omega t - \phi)\right)\right]$$

Setting $$\phi = \frac{\pi}{2},$$

this becomes:

$$Z = \frac{8}{3\pi}\left[\sin\omega t + \frac{7}{5}\sin 3\omega t\right]$$

Thus by selecting $$\phi = \frac{\pi}{2},$$

one may reduce the fundamental frequency component by ⅓ and simultaneously almost triple the third harmonic generation. All of this is achieved with only a slight increase in RMS current.

For a 22% increase in RMS current, third harmonic production is increased from $$\frac{4}{3\pi} \text{ to } \frac{56}{15\pi},$$

or nearly 9 dB. Meanwhile, fundamental output is reduced from $$\frac{4}{\pi} \text{ to } \frac{8}{3\pi},$$

or roughly 3.5 dB. Thus conversion efficiency quadruples as the rejection of undesired terms improves by 12 dB.

Figure 2:
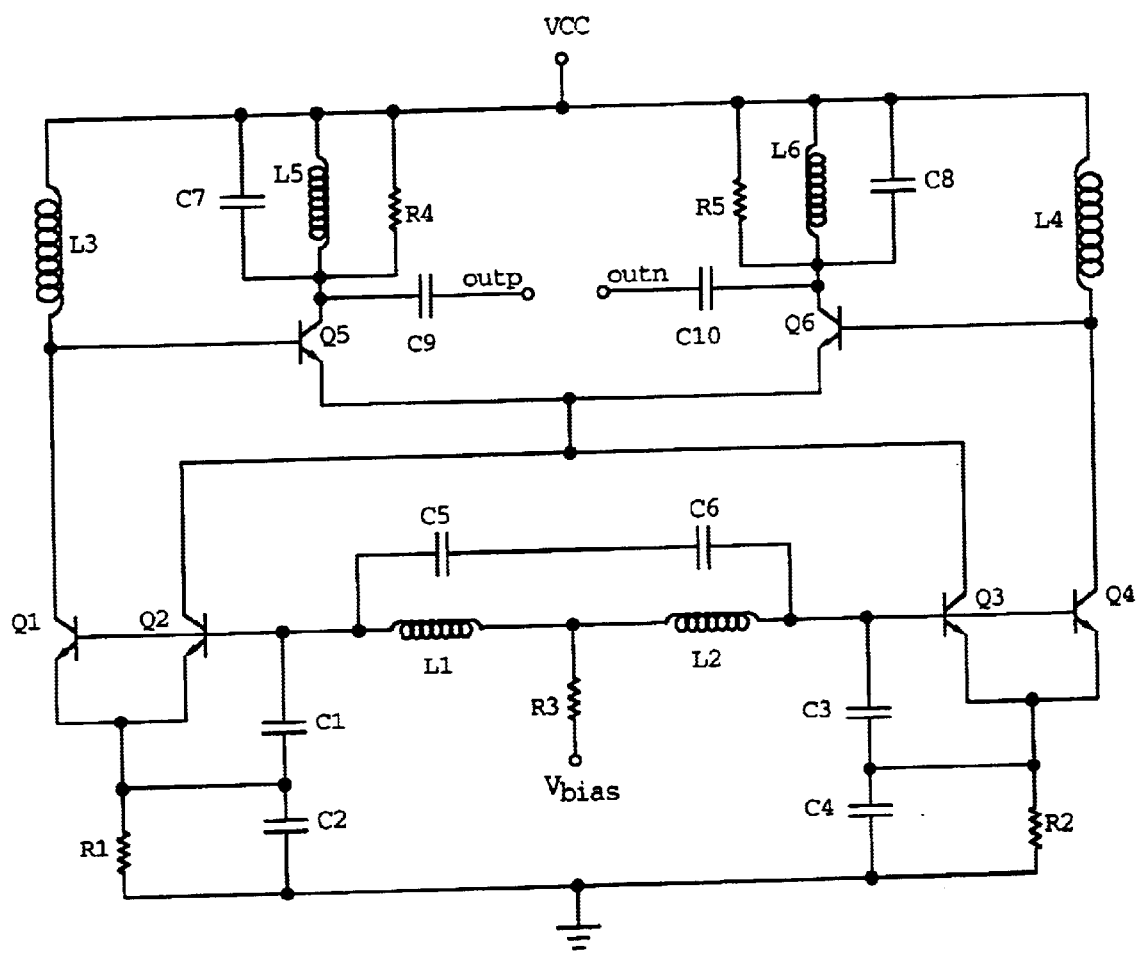
FIG. 2 is a circuit diagram for a differential Colpitts oscillator based implementation of the present invention.

A circuit shown in FIG. 2 employed to realize (approximate) these relationships in a preferred embodiment is built around a differential Colpitts oscillator. The Colpitts oscillator has the advantage of low noise and the differential nature provides 180° phase opposite output signals. The basic devices of the Colpitts oscillator are resistors R1 through R3, capacitors C1 through C6, inductors L1 and L2, and transistors Q1 through Q4. Note that the two transistors of a conventional differential Colpitts oscillator are split into four transistors, transistors Q1, Q2 and transistors Q3, Q4. Thus some of the core current from each half or leg of the differential oscillator devices is summed to provide a second harmonic signal approximating the $$1 + \sin\left(2\omega t + \frac{\pi}{2}\right)$$

multiplicand described earlier. (Note that by way of example, a full wave rectified sine wave will provide a constant, a twice frequency component, and additional even harmonic components, the additional even harmonics having little effect on the performance of the present invention. Other techniques may be used as desired to generate a term in the general form of $$1 + a\sin\left(2\omega t + \frac{\pi}{2}\right)$$

plus other even harmonics, where a is a constant.) The remainder of the current is fed from the collectors of transistors Q1 and Q4 into the differential load of inductors L3 and L4. The inductive load serves to provide a voltage with the appropriate phase shift to drive the modulator (drive the bases of transistors Q5 and Q6). The modulator uses the second harmonic common-mode signal described above as the tail current for transistors Q5 and Q6. Specifically, the inductors are used to provide the appropriate 90° phase shift in the switching signal applied to the bases of transistors Q5 and Q6 such that every transition of the modulator occurs on the peak of the second harmonic. The result is that the fundamental is multiplied by the second harmonic substantially according to the equations calculated above:

$$Z = \text{SIGN}(\sin\omega t) \times \left(1 + \sin\left(2\omega t + \frac{\pi}{2}\right)\right)$$

The tank circuits formed by capacitor C7, inductor L5 and resistor R4, and capacitor C8, inductor L6 and resistor R5 provide resonant collector loads for transistors Q5 and Q6, respectively, which are particularly responsive to the third harmonic to provide the same as capacitively coupled to the differential outputs outp and outn by coupling capacitors C9 and C10. The resistors R4 and R5 prevent excessive resonance in the tank circuits and broaden their response, as the present invention is intended to be used in an RF device wherein the Colpitts oscillator is tunable over a frequency range by varactors in the oscillator tank circuit (inductors L1 and L2 and capacitors C5 and C6).

While a preferred embodiment of the present invention has been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A method of tripling a fundamental frequency comprising:
    a) providing a fundamental frequency using a Colpitts oscillator;
    b) using circuitry coupled to the Colpitts oscillator, doubling the fundamental frequency to provide a twice frequency signal component;
    c) using circuitry coupled to the Colpitts oscillator, adding a constant to the twice frequency signal component to provide a constant plus twice frequency term; and,
    d) using circuitry coupled to the Colpitts oscillator, multiplying the constant plus twice frequency term by a square wave at the fundamental frequency to provide a tripler output;
    the phasing and the relative weighting of the twice frequency component being selected to increase the third harmonic relative to the fundamental frequency component in the tripler output.

2. The method of claim 1 wherein the multiplication of d) is done using a modulator having modulator switches driven by the fundamental frequency signal.

3. The method of claim 1 wherein the twice frequency signal component and the constant have approximately the same magnitude.

4. The method of claim 1 wherein the Colpitts oscillator is a differential Colpitts oscillator.

5. The method of claim 4 wherein resonant tank circuits tuned to three times the fundamental frequency are coupled to the tripler outputs.

6. A method of tripling a fundamental frequency comprising:
    a) providing a differential Colpitts oscillator operating into an inductive load in each leg of the differential oscillator to provide differential fundamental frequency signals;
    b) providing a pair of resonant circuits;
    c) providing a current responsive to the sum of the currents in the two legs of the differential Colpitts oscillator;
    d) alternately switching the current of c) to each of the two resonant circuits responsive to the voltage across the respective inductive load, the voltage between the resonant circuits being a differential signal having a component at three times the fundamental frequency.

7. An oscillator and frequency tripler comprising:
    a differential Colpitts oscillator operating into an inductive load in each leg of the differential oscillator to provide differential fundamental frequency signals;
    a pair of resonant circuits;
    current circuitry providing a current responsive to the sum of the currents in the two legs of the differential oscillator; and
    switches alternately switching the current of the current circuitry to each of the two resonant circuits responsive to the voltage across the respective inductive load, the voltage between the resonant circuits being a differential signal having a component at three times the fundamental frequency.

* * * * *